Figure 1:
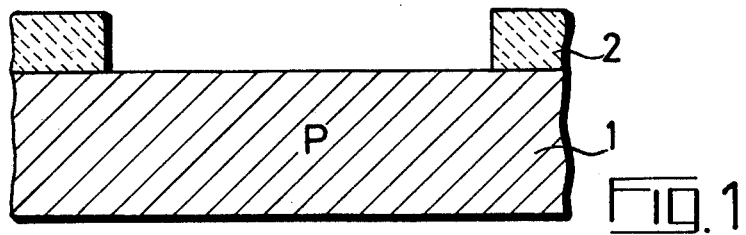
Figure 2:
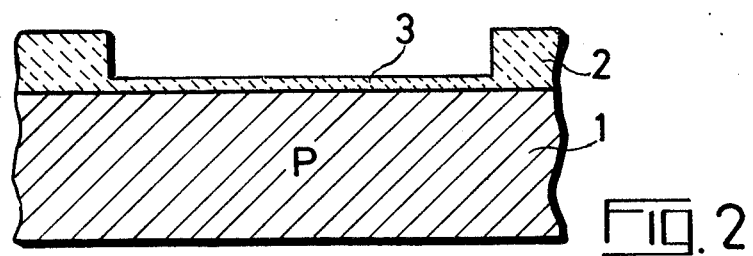

United States Patent [19]

Nuzillat et al.

[11] 4,013,483
[45] Mar. 22, 1977

[54] METHOD OF ADJUSTING THE THRESHOLD VOLTAGE OF FIELD EFFECT TRANSISTORS

[75] Inventors: Gérard Nuzillat; Christian Arnado, both of Paris, France

[73] Assignee: Thomson-CSF, Paris, France

[22] Filed: July 22, 1975

[21] Appl. No.: 598,165

[30] Foreign Application Priority Data

July 26, 1974  France ............................ 74.26057

[52] U.S. Cl. ................................. 148/1.5; 148/175; 148/186; 357/15
[51] Int. Cl.[2] ..................................... H01L 21/265
[58] Field of Search .................... 148/1.5, 175, 186; 357/15

[56] References Cited

UNITED STATES PATENTS

| 3,413,531 | 11/1968 | Leith | 357/23 |
|---|---|---|---|
| 3,539,876 | 11/1970 | Feinberg et al. | 148/186 UX |
| 3,558,366 | 1/1971 | Lepselter | 148/1.5 |
| 3,666,573 | 5/1972 | Brackelmanns | 148/175 |
| 3,676,229 | 7/1972 | Einthoven et al. | 148/186 |
| 3,753,774 | 8/1973 | Veldric | 357/15 |
| 3,774,088 | 11/1973 | Magdo et al. | 148/186 UX |
| 3,881,964 | 5/1975 | Cresswell et al. | 148/1.5 |
| 3,895,966 | 7/1975 | MacDougall et al. | 148/1.5 |

OTHER PUBLICATIONS

Kircher et al. "Interconnection Method for Integrated Circuits" IBM Tech. Disc. Bull., vol. 13, No. 2, July '70, p. 436.

*Primary Examiner*—G. Ozaki
*Assistant Examiner*—J. M. Davis
*Attorney, Agent, or Firm*—Cushman, Darby & Cushman

[57] ABSTRACT

A method of adjusting the threshold voltages of field effect transistors, in particular of SCHOTTKY gate field-effect transistors, is provided. During the process of manufacture of the transistor, the channel charge carrier density is modified by ion implantation. A monitoring device, in the form of a test transistor, is manufactured at the same time as the production transistors and on the same wafer thereas. An appendix of the test transistor makes it possible to measure the threshold voltage and saturation current, during ionic implantation.

5 Claims, 11 Drawing Figures

METHOD OF ADJUSTING THE THRESHOLD VOLTAGE OF FIELD EFFECT TRANSISTORS

The present invention relates to a method of adjusting the threshold voltages of field-effect transistors, more particularly to the adjustment of junction-type field-effect transistors.

The methods thus far known in the context of the manufacture of junction-type field-effect transistors, whether these be of Schottky junction type or p-n junction type, do not make it possible to produce the nominal threshold voltages and saturation current in a sufficiently accurate and consistent manner. The transistors in question may be of two types: the normally open channel type or the normally closed channel type. The error occurring in the threshold voltage, depends closely upon the concentration of doping impurities in the channel. In particular, a given error in the concentration gives rise to an inaccuracy in the threshold voltage which is the greater the closer the transistor approaches to a normally closed situation, this being the case in which a precise, given value of the threshold voltage cannot, at the current state of the art, be directly achieved. An adjustment is obtained in effect, by the rediffusion of the doping impurities from the gate, in the case of field-effect transistors with p-n junctions, and, if it is a field-effect transistor with a Schottky junction which is involved, then the adjustment takes place by penetration into the channel of the metal compound constituting the gate.

These two techniques have recourse to a heat treatment and are methods of approximation, using a step-by-step technique, which do not enable precise calibration to be effected, especially indeed if the absolute value of the threshold voltage is low. Moreover, adjustment is only possible in one direction, that is to say the only effect which it can produce is to reduce the absolute value of the threshold voltage and the nominal current. In addition, where the dimensions of these transistors do not enable direct measurement of these parameters to be carried out during operation of the devices, for example because the gate dimensions are too small, it is necessary to provide a much larger test transistor. This latter then furnishes indications from which it is then necessary to deduce by calculations the true values obtained from the production transistors.

Finally, if several types of transistors are present upon one and the same substrate, then it is impossible to differentiate the adjustment of each of them without interfering with the parameters governing their neighbours.

The object of the present invention is to overcome these drawbacks.

According to the invention, there is provided a method of adjusting threshold voltages of junction-type field-effect transistors, comprising the following stages:

i. starting from a semiconductor wafer having a first type of conductivity, manufacturing of a plurality of production devices destined to become junction-type field-effect transistors, each possessing a source, a drain, a gate and a semiconductor region destined to become the channel of a field-effect transistor, and concomitant manufacturing, on the same wafer, of a monitoring device possessing a source, a drain, a gate and a semiconductor region destined to become the channel of a test field-effect transistor;

ii. ionic implantation in said wafer to modify the conductivity type of said regions, and concomitant measuring at the threshold voltage of said monitoring device, the ionic implantation being stopped when the threshold voltage, in the test transistor, has reached a predetermined value.

The invention will be better understood from a consideration of the following explanations and the attached drawings in which:

FIGS. 1 to 7 illustrate the chief stages in the manufacture of a junction-type field-effect transistor, which precede the adjustment stage in accordance with the invention.

Figure 8:
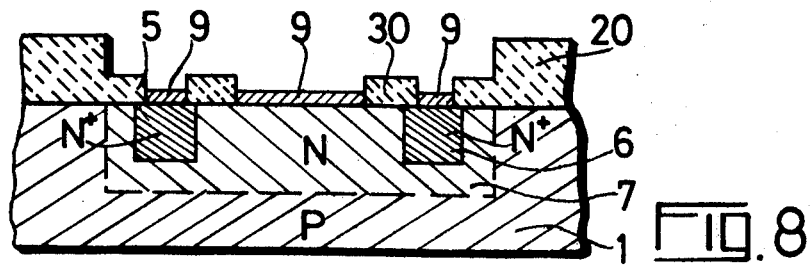

FIG. 8 schematically illustrates the state in which this kind of transistor lends itself particularly well to the operation of adjustment of the threshold voltage in accordance with the invention.

Figure 10:
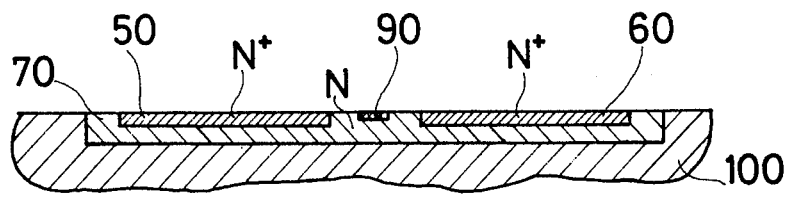
Figure 9:
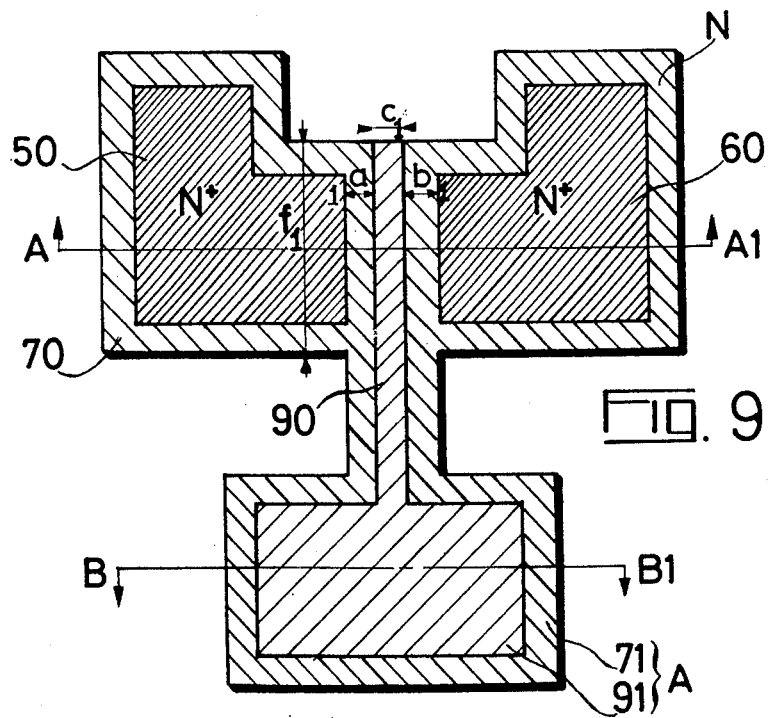
Figure 11:
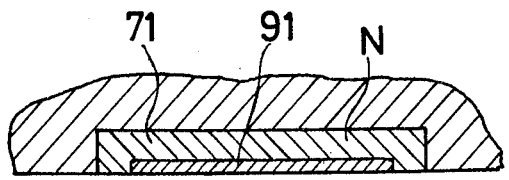

FIGS. 9, 10 and 11 illustrate in plan and in section, a monitoring device which can be used to test and correctly regulate the operation of adjustment in accordance with the invention.

Similar elements are given similar references in all the drawings.

Figure 3:
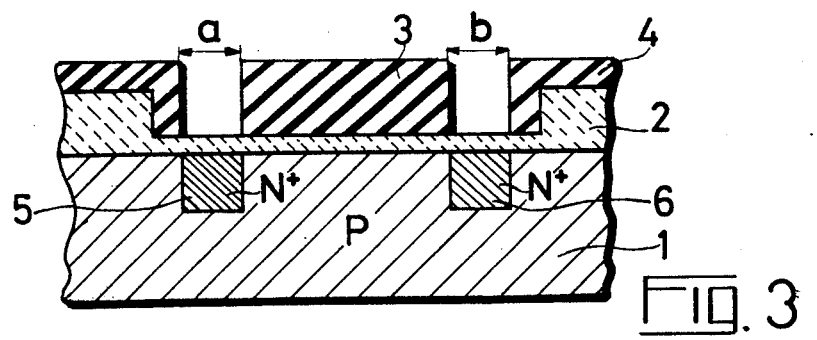
Figure 4:
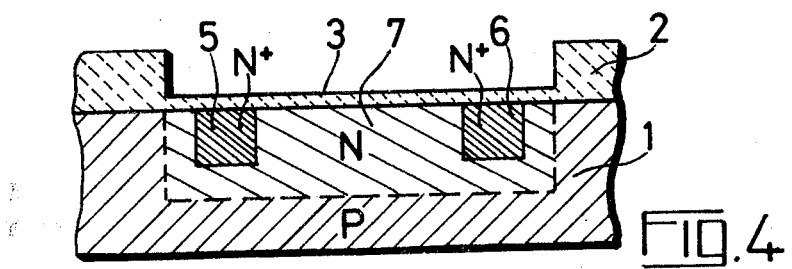
Figure 5:
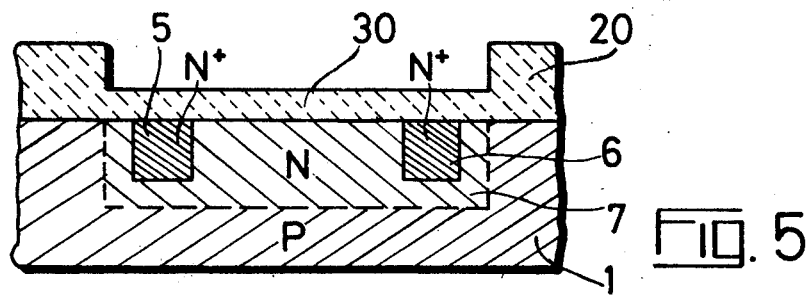
Figure 6:
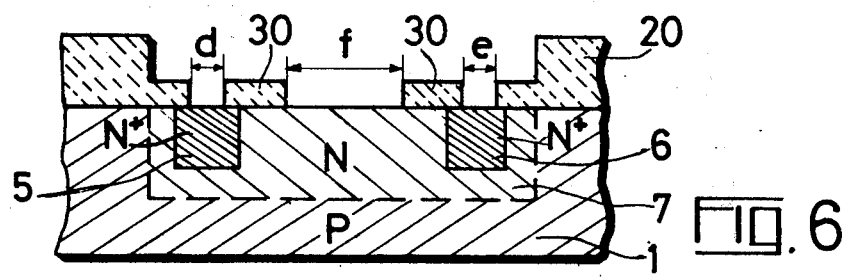
Figure 7:
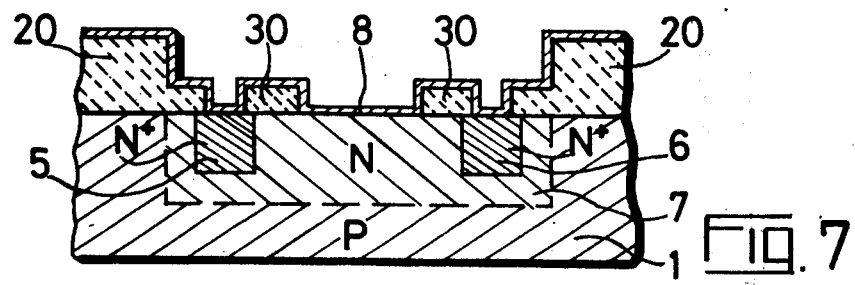

FIG. 1 illustrates a semiconductor wafer 1. In an example which is by no means limitative of the scope of the invention, this wafer 1 is for example made of p-type silicon. A silica, $SiO_2$, layer marked 2 in the Fig., is created at the surface of the wafer, and this is then etched, utilising conventional techniques of protection of the surface with locally deposited photoresist masks. Subsequently, in the zone where this deposit has been eliminated, there is produced in situ, in the manner shown in FIG. 2, a thin layer 3 likewise of silica $SiO_2$. By way of indication, the first layer 2 can have a thickness of the order of 6000 A, whilst the layer 3 will have a layer of only around 400 A for example. As FIG. 3 shows, a resin mask 4 is arranged at the surface of the sample. The mask 4 comprises two windows a and b through which there are created, in the body of the wafer 1, zones which are very highly doped with impurities of a type opposite to those used for the doping of the wafer 1. In the present instance, we are concerned therefore with zones 5 and 6 of $N^+$ - type. In the example described, this $N^+$ doping of the zones 5 and 6 is achieved in a manner known per se, by ion implantation through the thin silica layer 3 which is permeable vis-a-vis the doping ions. Another technique which could be used, would be to create said zones 5 and 6 by impurity diffusion or by other known methods. After having eliminated the resin mask 4 (FIG. 4) a fresh N-type zone 7 is created inside the wafer 1, for example by ion implantation. Then, the initial silica layers 2 and 3 are consolidated using a pyrolitic technique, to form new layers 20 and 30 whose respective thicknesses may be of the order of 7000 A and 1500 A, as FIG. 5 shows. Windows d, e and f are provided respectively opposite the highly-doped $N^+$ - type zones 5 and 6, and opposite the N-type zone 7 (FIG. 6). Finally, (FIG. 7) a layer of a material 8 is deposited, which is capable of forming in association with the silicon a compound permeable vis-a-vis doping ions designed to be injected across said compound into the silicon of which the wafer 1 is made. Such a material may for example be a layer of palladium having a thickness of the order of 200 to 250 A. A heat treatment transforms this palladium layer Pd in situ into palladium silicide 9 (Si Pd), at all points where the metal is in contact with the silicon.

The unconverted palladium is eliminated by selective chemical etching, the chosen reactive agent attacking the palladium and not reacting with the palladium silicide.

The structure of the device thus obtained has been schematically shown in FIG. 8. A device of this kind essentially comprises a drain and a source, 5 and 6 ($N^+$ - type), and an N - type channel 7, formed upon a P-type substrate 1. The drain, the source and the channel are covered by the layer 9 of Si Pd. The layer 9 located above the channel constitutes the gate of the transistor.

It is from this stage onwards and due to the configuration of the device thus obtained as well as to the elements of which it is made up, that the process of adjusting the threshold voltage in accordance with the invention, can be implemented. In other words, to vary the threshold voltage it is necessary to vary in one direction or other the concentration of the charge carriers in the channel. It is well known, indeed, that in a field-effect transistor of junction type, the threshold voltage is governed by the following parameters:

$$V_t = \frac{q\sigma a}{2\epsilon \epsilon_o}$$

$q$ : elementary charge
$\sigma$ : number of charge carriers per $cm^2$ in the channel
$a$ : channel depth
$\epsilon$ and $\epsilon$ : relative permitivity of the semiconductor and permitivity of free space.

By varying the number of charge carriers per $cm^2$ in the channel, the threshold voltage can be increased or reduced.

In accordance with the invention regulation of the doping of the channel 7 is effected by means of a doping method which resorts to ion implantation, this consisting in injecting doping ions into the crystal by giving them very high energies. This energy is achieved by means of a system which focuses and accelerates the ions coming from a source, in a manner known per se.

In the case of the palladium silicide Schottky junction field-effect transistor, shown in FIG. 8 and described by way of non-limitative example here, an increase in the absolute value of the threshold voltage can be obtained by means of arsenic ions implanted with an energy of the order of 140 KeV. The sensitivity of adjustment of the resultant voltage, around a zero threshold voltage, is then of the order of 50 mV where the bombardment has a density of $10^{11}$ ions per $cm^2$. If the implantation energy of these same arsenic ions is 130 KeV, the sensitivity of adjustment about the same threshold voltage is then of the order of 15 mV for the same density of bombardment. In the case where a reduction in absolute value in the threshold voltage is to be achieved, the ions chosen for implantation are in this case boron ions and the sensitivity of adjustment of the threshold voltage, around the value $V_T = 0$, for an implantation energy of 20 KeV, is about 20 mV in case of a density of $10^{11}$ ions per $cm^2$.

This method of doping by ion implantation can be employed in the present instance due to the configuration of the device shown in FIG. 8. The palladium silicide which forms the Schottky junction is in other words permeable to the ions requiring implantation and makes it possible to dope the underlying channel. Any other metal compound having this property and capable of forming a Schottky junction, could equally well be used.

This implantation can be effected either across a mask or directly over the whole area of the device. In other words, doping ions which happen to overlap the channel zone do not constitute any particular problem. All that they might do is to penetrate the silica $SiO_2$ layer (20), which would have no influence upon the performance of the device, or penetrate the $N^+$ - type drain or source, 5 and 6 respectively. In this case, the charateristics of the transistor would be improved. What has been said in the context of a P-type substrate and an N-type channel, remains true in the case where the substrate is of N-type material and the channel of P-type material.

The ions chosen are either donors or acceptors, as the case may be.

This is an essential feature of the invention to adjust the transistor parameters (such as threshold voltage and saturation current) in the course of the manufacturing process during the step consisting of doping the channel by ionic implantation.

To do this, a monitoring device designed to accurately determine the quantities which are being adjusted, is formed on the same substrate as the actual transistors being manufactured. In accordance with the invention, the geometry of the monitoring device thus formed, corresponds with that of the active part of the transistors proper.

This monitoring device has been shown respectively in plan in FIG. 9 and in section on the line $AA_1$ in FIG. 10 as well as in section on the line $BB_1$ in FIG. 11.

It comprises a zone 50 corresponding to the source and a zone 60 corresponding to the drain, both of $N^+$ - type material and of fairly large size to make it possible to attach the test equipment, and N- type channel 70 and a gate 90 formed, as in the case of the transistor described earlier, from palladium silicide.

The respective distances $a_1$ and $b_1$ separating the source and the drain from the gate, as well as the width $c_1$ of said gate, correspond to the dimensions of the active parts of the transistor proper. They are therefore identical in the case of the monitoring device and the actual production transistors being produced on the same wafer. This condition having been respected, the result is an equivalence between the parameters measured on the monitoring device and the true values obtained in the production transistors. In accordance with an important feature of the invention, in order to make it possible to effect measurement at the monitoring device, even in the case where the dimensions $a_1$, $b_1$ and $c_1$ of a first part of the device are extremely small and in any case do not enable a direct measurement to be made, a second part is provided to extend said first active part whose length is $f_1$, as follows: the N-type channel 70 which has the non-limitative form shown in FIG. 9 and delimits a channel of length $f_1$, is extended in accordance with the profile marked 71 in FIG. 9.

Above this channel 70, extended in accordance with the profile 71, the gate 90 is extended in accordance with the profile 91. Under these circumstances, the gate contact is therefore extended towards the exterior. Its continuity is ensured by the metallic compound and its insulation from the substrate by the junction formed by the metal compound and the N-doped semiconductor. If, instead of a Schottky junction, it were a P-N or N-P junction which were involved, this insulation would also be assured.

During the ion implantation operation, the doping is limited by means of a mask at the channel of the monitoring device, in the same way as for the production transistors being manufactured at the same time on the same wafer. Measurement in accordance with the known procedures is effected during the step of ion implantation or between two partial steps of the same. For instance predetermined points are pricked with the help of testing pins.

The measurement is made easy due to the appendix A constituted by the extension of the channel 71 and the gate 91.

The example described related to the adjustment of the threshold voltage, but in fact the adjustment of the nominal saturation currents can be effected by the same method since one of the parameters governing this value is also the number of charge carriers per $cm^2$ in the channel of the device.

As stated earlier, the adjustment of these parameters, threshold voltage and nominal saturation current, is effected by bombarding the specimen overall or through a mask, with selected ions. The choice of the energy and the ionic density makes it possible to effect an adjustment. The ionic density is small ($10^{11}$ to $10^{13}$ ions/$cm^2$ for example) and do not affect the gate.

In the case where different types of transistors have to be formed on the same wafer, the method of adjustment in accordance with the invention can also be employed. A masking system is provided in this case in order to protect those devices not concerned, during the operation of ion implantation which is carried out on the device requiring adjustment. Monitoring devices in accordance with the invention, can then be provided in respect of the different types of transistors formed on the same substrate.

As in any method which has recourse to ion implantation, a heat treatment is carried out in accordance with the conventional procedures, at the end of the adjustment process, in order to normalise the crystal which will have been disturbed by the implantation operation. This is a relatively low-temperature treatment which runs no risk of disturbing the other parameters of the device.

Finally, the contacts are formed in a conventional fashion by metallising, for example by applying a layer of a modybdenum and gold compound to the drain, source and gate.

What we claim:

1. A method of adjusting threshold voltages of field-effect transistors comprising the following steps:

i. starting from a semiconductor wafer having a first type of conductivity, manufacturing a plurality of production devices destined to become field-effect transistors, each possessing a source, a drain, a gate constituted by a metal compound, and a semiconductor region destined to become the channel of a field-effect transistor, and concommitant manufacturing, in the same wafer, of a monitoring device possessing a source, a drain, a gate constituted by said metal compound and a semiconductor region respectively of the same type as the source, drain, gate and semiconductor region of any production transistor, and an appendix electrically connected to the gate of said monitoring device, and electrically insulated from the source and drain of said monitoring device, said appendix being made of the same metal compound as said gates having dimensions which make it possible to contact it with measuring means;

ii. implanting ions in said wafer to modify the conductivity type of said regions, and concommitant measuring of the threshold voltage of said monitoring device, and iii. stopping ionic implantation when the threshold voltage, in the monitoring device reaches a predetermined value.

2. A method as claimed in claim 1, including the step of obtaining in said metal compound by in situ conversion of a layer of metal with the underlying semiconductor wafer.

3. A method as claimed in claim 2, wherein said semiconductor is silicon and said metal compound is a palladium silicide.

4. A method as claimed in claim 3, wherein said step of implanting includes of arsenic ions with an energy ranging from 130 to 140 keV.

5. A method as claimed in claim 3, wherein said step of implanting includes implanting of boron ions with an energy of the order of 20 keV.

* * * * *